United States Patent [19]

Ohishi et al.

[11] Patent Number: 4,816,806

[45] Date of Patent: Mar. 28, 1989

[54] DIAGNOSIS SWITCH

[75] Inventors: Tatsuo Ohishi, Toyohashi; Hiroshi Furuhashi, Shizuoka, both of Japan

[73] Assignee: Suzuki Jidosha Kogyo Kabushiki Kaisha, Shizuoka, Japan

[21] Appl. No.: 99,592

[22] Filed: Sep. 22, 1987

[30] Foreign Application Priority Data

Sep. 24, 1986 [JP] Japan ............................ 61-146112[U]

[51] Int. Cl.⁴ ......................... G08B 29/00; B60Q 1/00
[52] U.S. Cl. ..................................... 340/514; 340/459
[58] Field of Search ..................... 340/514, 52 R, 518, 340/500; 324/158 R, 158 F

[56] References Cited

U.S. PATENT DOCUMENTS 4,214,227  7/1980  Papasideris ........................... 340/514
4,274,087  6/1981  Swanson et al. ..................... 340/514
4,441,100  4/1984  Galloway ............................. 340/514

Primary Examiner—Donnie L. Crosland
Attorney, Agent, or Firm—Flynn, Thiel, Boutell & Tanis

[57] ABSTRACT

A diagnosis system has a diagnosis switch, and has a controller actuated by the switch for checking the operation of sensors and circuits and for lighting an alarm lamp in accord with a coded lighting signal, the number of times the alarm lamp is lit indicating the result of the diagnosis. The diagnosis switch includes a pair of diagnosis terminals which are similar to a pair of fuse terminals and are provided in a fuse box or in a joint box having a fuse box, and includes a spare fuse which can be inserted into the diagnosis terminals so as to produce a signal to the controller for starting the diagnosis.

4 Claims, 2 Drawing Sheets

DIAGNOSIS SWITCH

FIELD OF THE INVENTION

The present invention relates to a diagnosis switch for actuating a diagnosis system.

BACKGROUND OF THE INVENTION

Various proposals have been made concerning diagnosis systems having controllers with a self-diagnosis function for sensor systems.

FIG. 3 is a block diagram showing an example of an existing diagnosis system, and FIG. 4 is a waveform chart which depicts a phase of operation of the system.

In FIG. 3, reference numerals 11 to 19 denote various sensors, reference numeral 2 denotes a controller, reference numeral 3 denotes a lamp, reference numeral 4 denotes an ignition switch, reference number 5 denotes a fuse, reference numeral 6 denotes a battery, reference numeral 7 denotes a connector, and reference numeral 8 denotes a diagnosis switch.

A diagnosis system is a system which performs self-diagnosis for the various sensors 11 to 19, the output signals of which are input to the controller 2. In this example, signals from sensors such as an $O_2$ sensor 11, a water temperature sensor 12, a throttle sensor 13, an intake air temperature sensor 14, and an air flow meter 15 are input to the controller. Other signals which are input to the controller include a turbo-supercharging pressure signal and an ignition signal.

The result of the diagnosis is displayed by lighting the lamp 3. The diagnostic checking is started by turning on the ignition switch 4 and simultaneously turning on the diagnosis switch 8 provided for the checking (FIG. 4 (a)). A diagnosis code is output by turning the lamp 3 on and off a certain number of times in a certain timing pattern. From among the codes to which the sensors 11 to 19 correspond, a diagnosis code is output three times, in a sequence starting with the smallest code number. For example, in the case of the throttle sensor 13, the lamp 3 is caused to flash in accordance with the code signal shown in FIG. 4 (b) to indicate that a specific abnormality has occurred in the throttle sensor 13.

When a sensor is diagnosed as abnormal during the diagnostic operation, the lamp 3 is lit so as to indicate the abnormality to an operator.

One of the problems of this existing diagnosis system is that, because the exclusive switch 8 has to be provided to actuate the diagnosis function, an increase in production costs results and additional space for the switch is needed.

In addition, although the exclusive connector 7 is provided, it is often the case with this connector that it is not particularly located in a fixed place. Consequently, it has been difficult to find the connector 7 when it is to be used. Further, when there are other connectors, it has been difficult to distinguish with certainty the connector for the diagnosis. If the connector is fixed at a certain location with the view to avoiding these problems, this may again lead to an increase in production costs.

FIG. 5 shows an example of a different existing diagnosis switch. In particular, where no exclusive switch 8 is provided, a short-circuiting connector 80 comprising a lead wire 81 and a connector element 82 ahs to be provided for each operator.

An object of the present invention is to provide a diagnosis switch in which a part of a fuse box is utilized, to thereby solve the problems such as those involving the fixing position and any increase in production costs.

SUMMARY OF THE INVENTION

In order to achieve the above-stated object, according to the present invention a diagnosis switch for a system of the above-mentioned type includes a pair of diagnosis terminals which are similar to a pair of fuse terminals and which are provided in a fuse box or in a joint box having a fuse box, and includes a spare fuse which can be inserted into the diagnosis terminals so as to obtain a signal for starting the diagnosis system.

BRIEF DESCRIPTION OF THE DRAWINGS

A preferred embodiment of the present invention will now be described in detail with reference to the drawings, in which.

DETAILED DESCRIPTION

Figure 1:
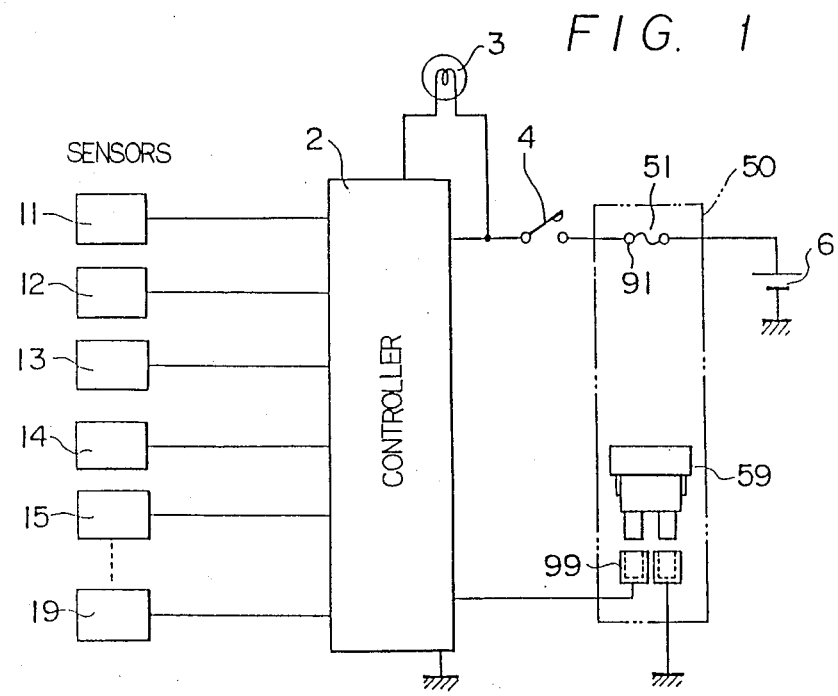
FIG. 1 is a schematic block diagram of a diagnosis system having a diagnosis switch according to the present invention.
Figure 2:
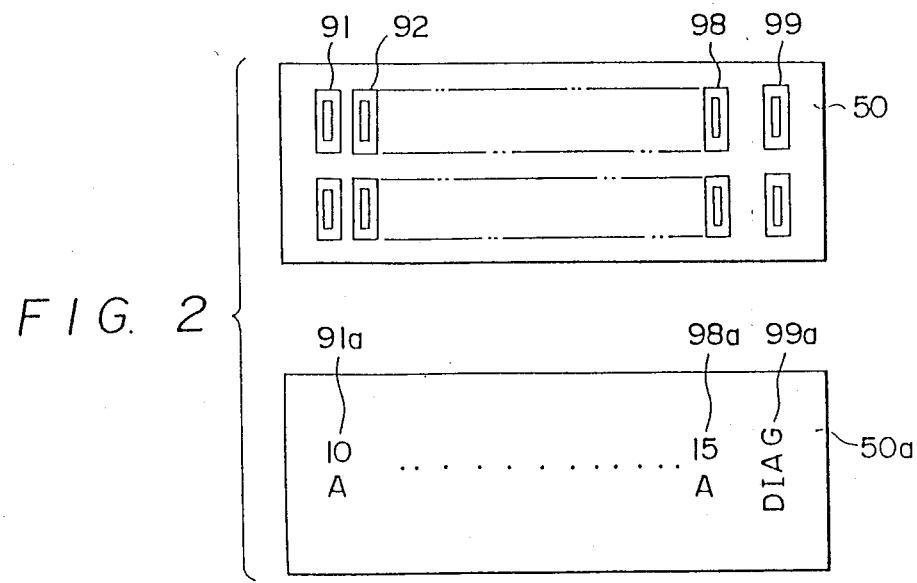
FIG. 2 is a diagrammatic view of a fuse box and cover which are components of the system of FIG. 1 and are provided with a pair of terminals serving as part of the inventive switch.
Figure 3:
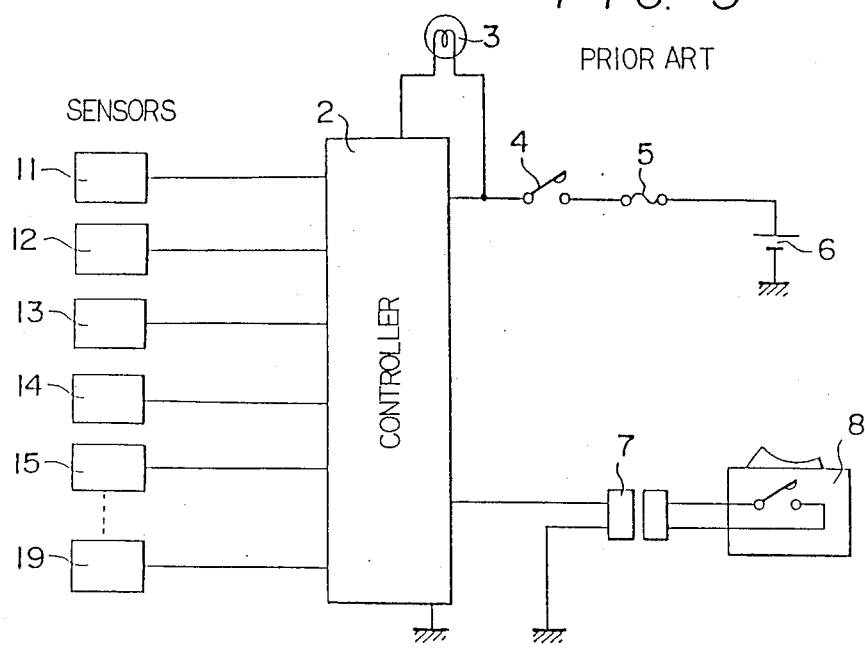
FIG. 3 is a schematic block diagram of an existing diagnosis system.
Figure 4:
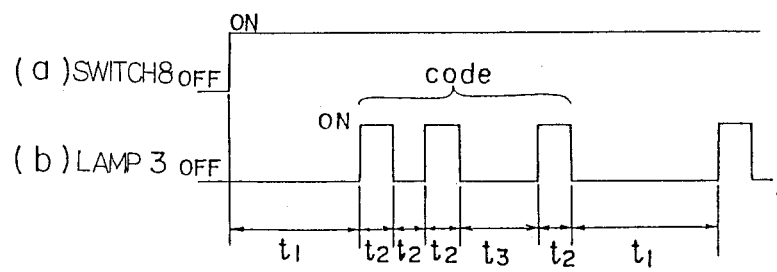
FIG. 4 is a waveform chart illustrating a phase of operation of the system of FIG. 3.
Figure 5:
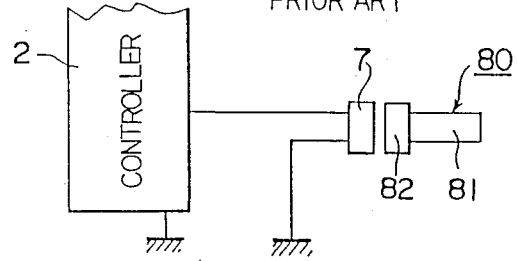
FIG. 5 is a fragmentary block diagram showing another existing diagnosis system.

FIG. 1 is a view showing a diagnosis system having a diagnosis switch in accord with the present invention. FIG. 2 is a view showing a fuse box which is provided with a pair of terminals constituting the inventive switch.

Components of the system which have the same functions as those of corresponding components in the above-described existing system are designated by the same reference numerals.

According to the present invention, a part of a fuse box 50 is utilized to provide a pair of terminals 99 for the diagnosis which are similar to each of several pairs of fuse terminals 91 to 98. Here, the term "fuse box 50" is used to also include a joint box having a fuse box. The terminals 99 are connected to the controller 2.

A cover 50a of the fuse box 50 usually carries on the reverse side thereof spare fuses 59 which are, for instances, two 10 A and 20 A spare fuses. Therefore, at the time of a diagnostic operation, one of these spare fuses 59 is inserted into the terminals 99 so as to short them and thereby provide the switching function.

The cover 50a has labels 91a to 98a which indicate the respective ampere limits of fuses for the pairs of terminals 91 to 98. If a label 99a such as "DIAG", indicative of the pair of diagnosis terminals 99, is also provided in a similar manner, this will enable these terminals to be visually distinguished with ease at the time of a diagnostic operation.

As described above in detail, according to the present invention an exclusive pair of diagnosis terminals are provided in the fuse box, thus facilitating the locating of the terminals at the time of a diagnostic operation, and thereby facilitating the diagnostic operation.

Since the switching function is effected with a spare fuse, no exclusive short-circuiting connector is needed and no increase in production costs is involved.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A diagnosis system, comprising a diagnosis switch and controller means actuated by said switch for checking the operation of sensors and circuits and for lighting an alarm lamp in accord with a coded lighting signal representing the result of the diagnosis; wherein said diagnosis switch includes a pair of diagnosis terminals which are fuse terminals, are connected to said controller means, and are provided in a fuse box, and includes a spare fuse which can be selectively manually inserted into and removed from said diagnosis terminals so as to respectively create and interrupt an electrical connection therebetween in order to respectively actuate and deactuate said controller means.

2. A diagnosis system according to claim 1, wherein said fuse box has thereon a label identifying said diagnosis terminals.

3. A diagnosis system according to claim 2, wherein said fuse box includes a first portion which has said diagnosis terminals thereon and a second portion which is a cover adapted to be removably coupled to said first portion and which has said label thereon.

4. A diagnosis system according to claim 3, wherein said cover has on a first side thereof said label, and has on a second side thereof remote from said first side means for removably supporting said spare fuse.

* * * * *